(12) United States Patent
Sasano

(10) Patent No.: US 9,153,561 B2
(45) Date of Patent: Oct. 6, 2015

(54) LIGHT-EMITTING DEVICE COMPRISING A METAL FILM ON A SUBSTRATE AND MANUFACTURING METHOD FOR THE SAME

(75) Inventor: Haruaki Sasano, Tokushima (JP)

(73) Assignee: NICHIA CORPORATION, Tokushima (JP)

( * ) Notice: Subject to any disclaimer, the term of this patent is extended or adjusted under 35 U.S.C. 154(b) by 289 days.

(21) Appl. No.: 13/641,339

(22) PCT Filed: Apr. 1, 2011

(86) PCT No.: PCT/JP2011/058422
§ 371 (c)(1),
(2), (4) Date: Oct. 15, 2012

(87) PCT Pub. No.: WO2011/129202
PCT Pub. Date: Oct. 20, 2011

(65) Prior Publication Data
US 2013/0038246 A1 Feb. 14, 2013

(30) Foreign Application Priority Data
Apr. 16, 2010 (JP) ................................. 2010-094717

(51) Int. Cl.
*H01L 29/18* (2006.01)
*H01L 21/00* (2006.01)
(Continued)

(52) U.S. Cl.
CPC ...... *H01L 25/0753* (2013.01); *H01L 23/49838* (2013.01); *H01L 27/156* (2013.01);
(Continued)

(58) Field of Classification Search
CPC ..... H01L 25/0753; H01L 33/62; H01L 33/60; H01L 33/52; H01L 23/49838; H01L 27/156; H01L 2224/481137
See application file for complete search history.

(56) References Cited

U.S. PATENT DOCUMENTS 6,599,768 B1 * 7/2003 Chen ............................... 438/22
7,521,863 B2 * 4/2009 Tanda ............................ 313/512
(Continued)

FOREIGN PATENT DOCUMENTS

JP 2004319939 A 11/2004
JP 2007150228 A 6/2007
(Continued)

OTHER PUBLICATIONS

International Search Report for WO Application No. PCT/JP2011/058422, dated Jul. 5, 2011.
(Continued)

*Primary Examiner* — Alonzo Chambliss
(74) *Attorney, Agent, or Firm* — Squire Patton Boggs (US) LLP

(57) ABSTRACT

A light-emitting device includes: a substrate; the metal film at the mounting region on the substrate; a light-emitting part including a plurality of light-emitting elements disposed on the metal film; metal members formed on the substrate, respectively including pad parts and wiring parts, forming a positive electrode and a negative electrode configured to apply a voltage to the light-emitting element through the wiring parts, respectively; and a plating wire connected to the metal film, extended to a side face of the substrate. The metal film and the metal members are independently disposed. The wiring part of the positive electrode and the wiring part of the negative electrode are formed at a circumference of the mounting region. The metal members are formed apart from the circumferential edge of the substrate on the side of the mounting region of the substrate.

12 Claims, 5 Drawing Sheets

(51) Int. Cl.
  *H01L 25/075*   (2006.01)
  *H01L 27/15*    (2006.01)
  *H01L 23/498*   (2006.01)
  *H01L 33/62*        (2010.01)
  *H01L 33/60*        (2010.01)

(52) U.S. Cl.
  CPC .............. *H01L 33/60* (2013.01); *H01L 33/62* (2013.01); *H01L 2224/45144* (2013.01); *H01L 2224/48137* (2013.01); *H01L 2933/0066* (2013.01)

(56) References Cited

U.S. PATENT DOCUMENTS 7,612,457 B2 * 11/2009 Mahler et al. ................. 257/782
8,049,237 B2 * 11/2011 Yamada et al. ................. 257/98
2004/0095782 A1    5/2004 Isoda
2007/0170454 A1 *  7/2007 Andrews ................. 257/100
2008/0099770 A1    5/2008 Mendendorp et al.
2009/0166657 A1    7/2009 Yamada et al.
2009/0180285 A1 *  7/2009 Tanda ................. 362/296.02
2010/0012957 A1 *  1/2010 Lin et al. ................. 257/98

FOREIGN PATENT DOCUMENTS

| | | |
|---|---|---|
| JP | 2008192949 A | 8/2008 |
| JP | 2009094207 A | 4/2009 |
| JP | 2009164157 A | 7/2009 |
| WO | 2008069204 A1 | 6/2008 |

OTHER PUBLICATIONS

European Search Report dated Oct. 24, 2014, for corresponding European Patent Application No. 11768723.6.

* cited by examiner

LIGHT-EMITTING DEVICE COMPRISING A METAL FILM ON A SUBSTRATE AND MANUFACTURING METHOD FOR THE SAME

TECHNICAL FIELD

The present invention relates to a light-emitting device usable as a lighting fitting such as an LED lighting bulb, a display device, a lighting equipment, a display, and a backlight light source for a liquid crystal display, etc. and a method of manufacturing the same.

BACKGROUND ART

Recently, various electronic parts have been proposed and practically used. Accordingly, desired performances of these electronic components have become high. This is also true for light-emitting devices, represented by a light-emitting diode (LED: Light-emitting Diode), and performances required in a general lighting industry field and an in-vehicle illumination field, etc. become high day by day. Accordingly, a further higher output power (higher brightness) and a higher reliability are required. In addition, the light-emitting devices with these characteristics are also required to be supplied at low costs.

There is a known light-emitting device of which light outputting efficiency is enhanced (see, for example, Patent Document 1). For example, an Au plating and an Ag plating are formed at different regions on an insulating member, and the Au plating, having a good contact with an Au wire, is used as an electrode surface, and an Ag plating, having a high reflectivity, is used as a reflecting surface.

As described above, in the case where plating of different materials are formed, two kinds of conducting layers for Au plating and Ag plating are independently formed as conducting layers for electroplating at regions on which plating is to be formed. Only one of the conducting layers is electrified for respective conducting layers to easily form plating of different materials at different regions. The conducting layers for electroplating are exposed on such a place that electrification with a plating device can be easily done, for example, on a side face or a back face of the insulating member.

PRIOR ART DOCUMENT

Patent Document

Patent Document 1: JP 2004-319939A (see FIGS. 1 and 3)

DISCLOSURE OF THE INVENTION

Problems to be Resolved by the Invention

However, in the prior art, there are problems described below.

Recently, a further higher output power has become required for the light-emitting device. It is important to suppress a temperature increase in the light-emitting device to provide a high power output by inputting a larger current. For example, the light-emitting device is placed on a metal body having a high heat dissipation. Regarding the prior art light-emitting device described above, a plurality of light-emitting devices are installed on a mounting substrate, and the mounting substrate is further installed on a metal body.

However, because the prior art light-emitting device uses Ag-plating having a high reflectivity on a reflection surface, a light output efficiency can be enhanced, but because a conducting layer is exposed at a side face or a back face of the insulating member, it is impossible to locate the side face and the back face close to the metal body. In a case where the conducting layer is exposed only on the side face of the insulating member, when the light-emitting device is driven while the back face of the insulating member are in contact with the metal body, short-circuit occurs due to surface discharge.

The invention has been developed in consideration of the above-described problems and aims to provide a light-emitting device capable of enhancing the light output of the light-emitting device and being directly installed on a metal body, and a method of manufacturing the light-emitting device.

Measures for Resolving the Problems

In order to solve the problems, the light-emitting device according to the present invention, comprising:
a substrate;
a metal film at a mounting region on the substrate;
a light-emitting part including a plurality of light-emitting elements disposed on the metal film;
metal members formed on the substrate, respectively including pad parts and wiring parts, forming positive and negative electrodes configured to apply a voltage to the light-emitting element through the wiring parts, respectively; and
a plating wire connected to the metal film and extended to a side face of the substrate, wherein
the metal film and the metal members are independently disposed; and wherein
the wiring part of the positive electrode and the wiring part of the negative electrode are formed at the periphery of the mounting region, and wherein the metal members are formed apart from a circumferential edge of the substrate on a side of the mounting region of the substrate.

According to this configuration, because the metal film is formed at a region where the light-emitting elements are installed, a light output efficiency (reflective efficiency) can be enhanced. In addition, the metal film and the metal member (electrode layers) are independently formed respectively and the metal member are formed away from a side face and a back face of the substrate. Accordingly, short-circuit due to surface discharge while the light-emitting device is driven can be prevented.

It is preferable that the plating wire is formed inside the substrate and connected to the metal film through a through hole formed in the substrate.

According to the configuration, there is no limit in arranging the metal member, so that the plating wire can be extended to a side face of the substrate without any limitation in arrangement of the metal member. According to this configuration, because the plating wire is not arranged on a top face of the substrate, there is no limitation in designing the light-emitting device. In addition, when the plating wire, having a higher heat conductivity than the substrate which is an insulating member, is disposed inside the substrate, a heat dissipation can be enhanced.

In addition, it is preferable that a part of the plating wire inside the substrate is exposed from the side face of the substrate.

According to this configuration, the heat dissipation can be further enhanced.

The substrate is formed in a predetermined shape having a pair of confronting sides and another pair of confronting sides, wherein the pad of the positive electrode and the pad of the negative electrode are formed along the one pair of the confronting sides. The plating wire is extended to another pair of the confronting sides. I addition, in plan view, it is preferable that the pad of the positive electrode and the pad of the negative electrode are not overlap with the plating wires.

According to this configuration, the voltage is not discharged to the pad part through the plating wire as a relay point, so that short-circuit due to this discharging can be prevented.

In addition, it is preferable that the metal film has a reflectivity regarding the light emitted by the light-emitting element higher than the metal member, and that Ag is used for the metal film and Au is used for the metal member.

According to this configuration, because the metal film has a reflectivity higher than the metal members, so that light output efficiency can be enhanced. Particularly, a light output efficiency can be further enhanced by using Ag, having a high reflectivity, for the metal film, and using Au for the metal member.

It is preferable that in the light-emitting device, a light reflecting resin is formed along a circumferential edge of the mounting region to cover at least the wiring part and a sealing member, having a translucency, is filled inside the light reflecting resin to cover the light-emitting element and the metal film.

According to the configuration, the light reflecting resin is formed to surround the mounting region, so that light toward a circumference of the mounting region of the substrate is reflected by the light reflecting resin. Accordingly, a loss in the output light can be reduced, so that the light output efficiency of the light-emitting device can be enhanced. In addition, because the sealing member is filled inside the light reflecting resin, so that parts inside the light reflecting resin are protected.

A method of manufacturing the light-emitting device according to the present invention, comprising:

a substrate manufacturing process of manufacturing a substrate where a plating wire is formed;

a plating process comprising:

forming a metal member providing positive and negative electrodes on the substrate where the plating wire is formed by electroless plating and forming a metal film by electroplating at a mounting region on the substrate;

a die bonding process of installing the light-emitting element on the metal film;

a wire bonding process of electrically connecting the positive electrode and the negative electrode to electrode terminals of the light-emitting element with wires after the die bonding process.

According to the method of manufacturing the light-emitting device, in the plating process, the metal member can be disposed at a location apart from the side face and the back face of the substrate by electroless plating, and the metal film is disposed at the mounting region of the light-emitting elements by electroplating. This configuration provides a light-emitting device in which short-circuit due to creeping discharge is prevented while the light-emitting device is being operated, and a light output efficiency is enhanced.

The plating process comprises:

forming metal members for providing the positive electrode and the negative electrode by electroless plating as well as at the mounting region, and then forming a metal film on the metal member at the mounting region by electroplating.

According to the method of manufacturing the light-emitting device, after forming the metal member by the electroless plating, the metal film is formed on the metal member at the mounting region, so that there is no need to use a mask, etc. and a flatness of the metal film is enhanced.

The method of manufacturing the light-emitting device according to the present invention, after the wire bonding process, a light reflecting resin forming process is included for forming the light reflecting resin to cover at least the wiring parts of the positive electrode and the negative electrode along a circumferential edge of the mounting region.

In addition, a sealing member filling process is included for filling a sealing member, having a translucency, inside the light reflecting resin to cover the light-emitting element and the metal film.

According to the method of manufacturing the light-emitting device, because the light reflecting resin and the sealing member can be formed, so that the light-emitting device with a further enhanced light output efficiency and a higher durability can be provided.

Advantageous Effect of the Invention

According to the light-emitting device according to the present invention, because the light output efficiency can be enhanced by the metal film formed at the mounting region of the light-emitting elements, the light output of the light-emitting device can be enhanced. In addition, because the positive electrode and the negative electrode are formed at locations apart from the side face and the back face of the substrate, short-circuit due to the creeping discharge can be prevented, even though the light-emitting device becomes in contact with a metal body. Accordingly, the light-emitting device can be directly installed on the metal body. In addition, because the plating wire is extended to the side face of the substrate, a heat dissipation can be enhanced.

According to the method of manufacturing the light-emitting device, the light-emitting device with a high output, which allows the light-emitting device to be directly installed on the metal body. Particularly, after forming the metal member by electroless plating, forming the metal film by the electroplating, so that the manufacturing process can be made simple, so that a productivity can be enhanced.

MODES FOR CARRYING OUT THE INVENTION

Hereinbelow with reference to drawings will be described a light-emitting device and a method of manufacturing the light-emitting device according to the embodiments of the present invention. It is noted that a size, a location relation, etc. of each member shown in each drawing may have some exaggeration for clearer explanation. In the below description, the same name, or the same sign designates the same member or the same quality member, and thus a detailed description will be omitted. In addition, in FIGS. 2 and 7 which will be referred in the below description, p-electrodes and n-electrodes (see FIG. 3) of the light-emitting elements are shown at only four locations at the mounting region to show a direction of each light-emitting element, and are not shown at other locations at the mounting region.

<<Light-Emitting Device>>

With reference to FIGS. 1 to 5, will be described a light-emitting device 100 according to the embodiment of the present invention in detail. In the following description, first, a whole configuration of the light-emitting device 100 will be described, and after that each configuration will be described. In addition, for illustration purpose, on the front view in FIG. 2, only an exterior of a light reflecting resin 6 is shown with a line in a transparent state.

<Whole Configuration>

Figure 1:
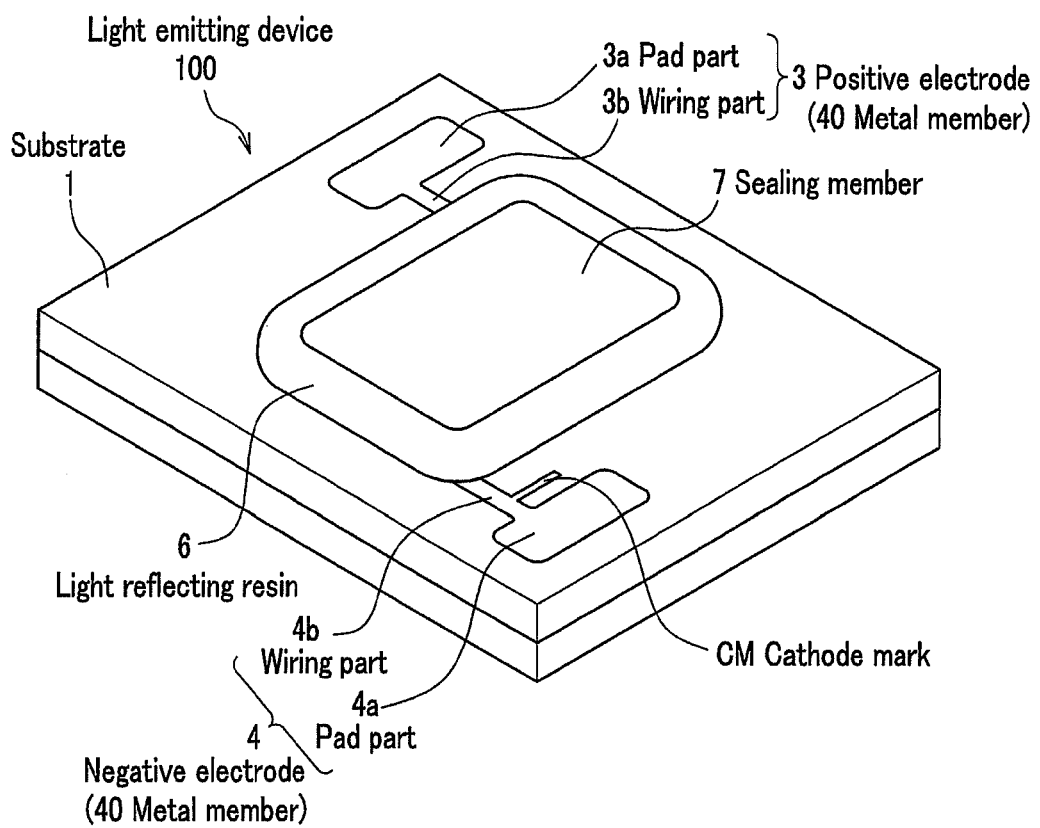
FIG. 1 is a perspective view showing a whole structure of the light-emitting device according to embodiments of the present invention.
Figure 2:
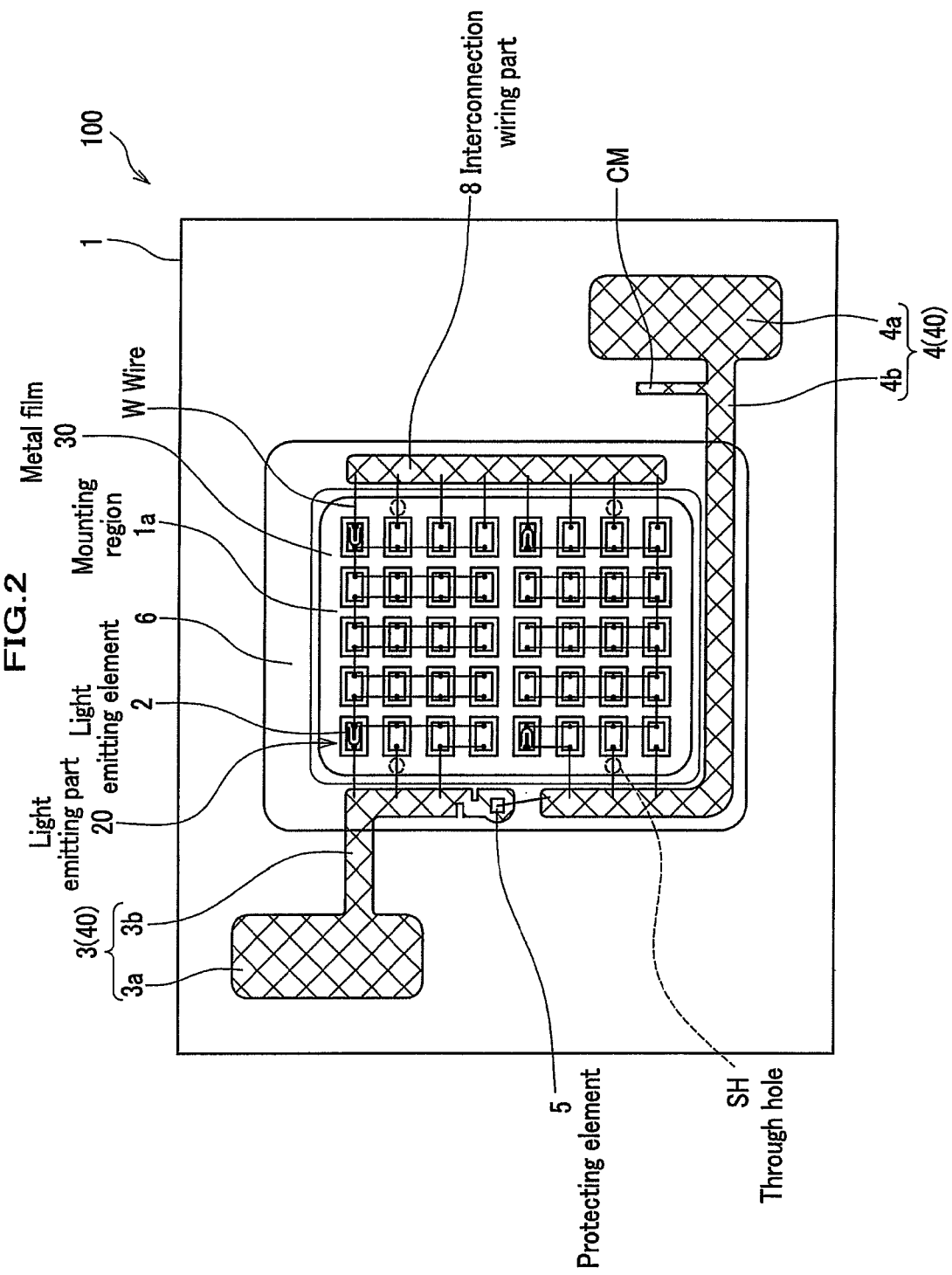
FIG. 2 is a front view showing the configuration of the light-emitting device according to the embodiments of the present invention.
Figure 4:
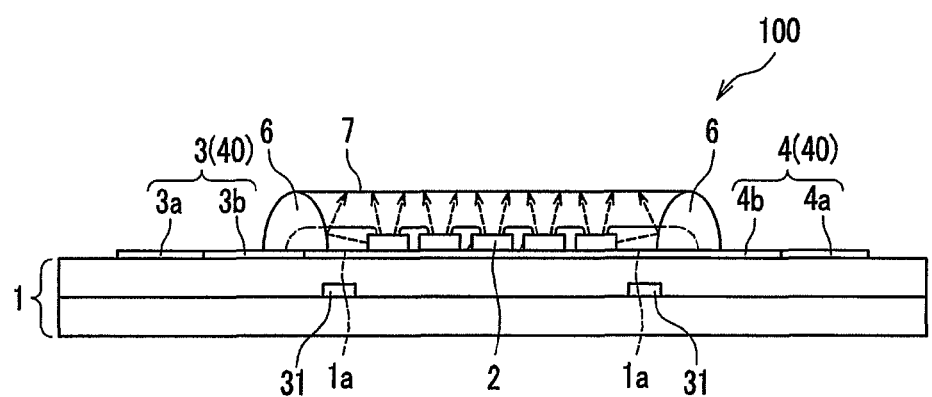
FIG. 4 is a side view showing the configuration of the light-emitting device according to the embodiments of the present invention.

The light-emitting device 100 is a device used as a lighting fitting such as an LED lighting bulb, a display device, a lighting fitting, a display, and a backlight light source for a liquid crystal display, etc. The light-emitting device 100 includes, as shown in FIGS. 1, 2, and 4, a substrate 1, a metal film 30 formed at a mounting region 1a on the substrate 1, a plurality of light-emitting elements 2 installed on the metal film 30, a metal member 40 forming a positive electrode 3 and a negative electrode 4 formed on the substrate 1, plating wires 31 connected to the metal film 30, electronic components such as the light-emitting elements 2 and a protecting element 5, and wires W for connecting the positive electrode 3 or the negative electrode 4 as main configuration. Further, here, a protecting element 5 disposed on the positive electrode 3, the light reflecting resin 6 formed on the substrate 1, and a sealing member 7 sealed in the mounting region 1a.

<Substrate>

The substrate 1 is provided for disposing electronic components such as the light-emitting elements 2 and the protecting element 5. The substrate 1 is, as shown in FIGS. 1 and 2, formed in a rectangular plate-like shape. In addition, on the substrate 1, the mounting region 1a is sectioned for disposing a plurality of the light-emitting elements 2. It is noted that a size of the substrate 1 is not specifically limited, but is appropriately selected in accordance with the aim and use such as the number of the light-emitting elements 2.

As a material of the substrate 1, it is preferable to use an insulating material difficult to transmit therethrough light emitted by the light-emitting element 2 and externally incoming light, etc. In addition, it is preferable to use a material having a substantially sufficient level of stiffness. More specifically, a ceramics ($Al_2O_3$, AlN, etc.), and a resin such as phenolic resin, epoxy resin, polyimide resin, and BT resin (bismaleimide triazine resin), and polyphthalamide (PPA) are usable.

<Mounting Region>

The mounting region 1a is a region for disposing a plurality of the light-emitting elements 2. The mounting region 1a is, as shown in FIG. 2, sectioned at a center region of the substrate 1. The mounting region 1a is formed in a predetermined shape having sides confronting each other, and more specifically, corners are rounded to have an approximately rectangular shape. In addition a size and a shape of the mounting region 1a is not specifically limited, and optionally selected in accordance with the aim and use such as the number of the light-emitting elements 2 and intervals between lines or rows of the light-emitting elements 2.

When FIG. 2 is viewed as a plan view, a part of the wiring part 3b and a part of a wiring part 4b are formed along a left side edge of the mounting region 1a, a part of the wiring part 4b is formed along a lower side of the mounting region 1a, and an interconnection wiring part 8 along a right side edge of the mounting region 1a, at a periphery of the mounting region 1a. It is noted that the periphery of the mounting region 1a means here a periphery spaced at a predetermined gap from a circumferential edge of the mounting region 1a as shown in FIG. 2.

The mounting region 1a is provided for forming the metal film 30 for reflecting light and disposing a plurality of the light-emitting elements 2 via the metal film 30 on the mounting region 1a. Because the metal film 30 is formed on the mounting region 1a and a plurality of the light-emitting elements 2 are disposed on the metal film 30, for example, in FIG. 4, light toward a side of the mounting region 1a of the substrate 1 can be reflected by the metal film 30. Accordingly, a loss in output light can be reduced, so that a light output efficiency of the light-emitting device 100 can be enhanced.

<Metal Film>

The metal film 30 is a layer for reflecting light emitted by the light-emitting element 2 and formed at the mounting region 1a on the substrate 1.

The metal film 30 formed on the mounting region 1a can be formed by electroplating. A material of the metal film 30 is not specially limited as long as the material can be used for plating. For example, Au (gold) can be used. Au has a characteristic easy to absorb light, however, a light reflectivity can be increased by further formation of a $TiO_2$ on a surface of an Au plating.

However, it is preferable to form the metal film 30 with a material having a reflectivity higher than the metal member 40 regarding light emitted by the light-emitting element 2. For example, it is preferable to use Au for the metal member 40 and Ag (silver) for the metal film 30. Because Ag has a higher reflectivity than Au, the light output efficiency can be enhanced. It is noted that a thickness of the metal film 30 formed on the mounting region 1a is not specifically limited and can be appropriately selected in accordance with the aim and the use. In addition, the metal film 30 and the metal member 40 are independently provided. More specifically, they are not electrically connected.

In the embodiment, as shown in FIGS. 1 and 4, at an upper part of the mounting region 1a, a sealing member 7 is filled to protect a plurality of the light-emitting elements 2 and the wires W connected to the light-emitting elements 2 from dust, water, and external forces, etc.

<Light-Emitting Element>

The light-emitting element 2 is a semiconductor element emitting light by itself when a voltage is applied thereto. A plurality of the light-emitting elements 2 are, as shown in FIG. 2, disposed on the substrate 1 at the mounting region 1a and become one to form a light-emitting part 20 in the light-emitting device 100. In addition, the light-emitting element 2 is adhered with an adhesive member (not shown) to the mounting region 1a. The connecting method using resin or solder paste as the adhesive member can be used. In addition, the light-emitting part 20 shown in the drawing only indicates a region for installing the light-emitting elements 2. The emission light in the light-emitting part 20 means light emitted by the light-emitting element 2.

Figure 3:
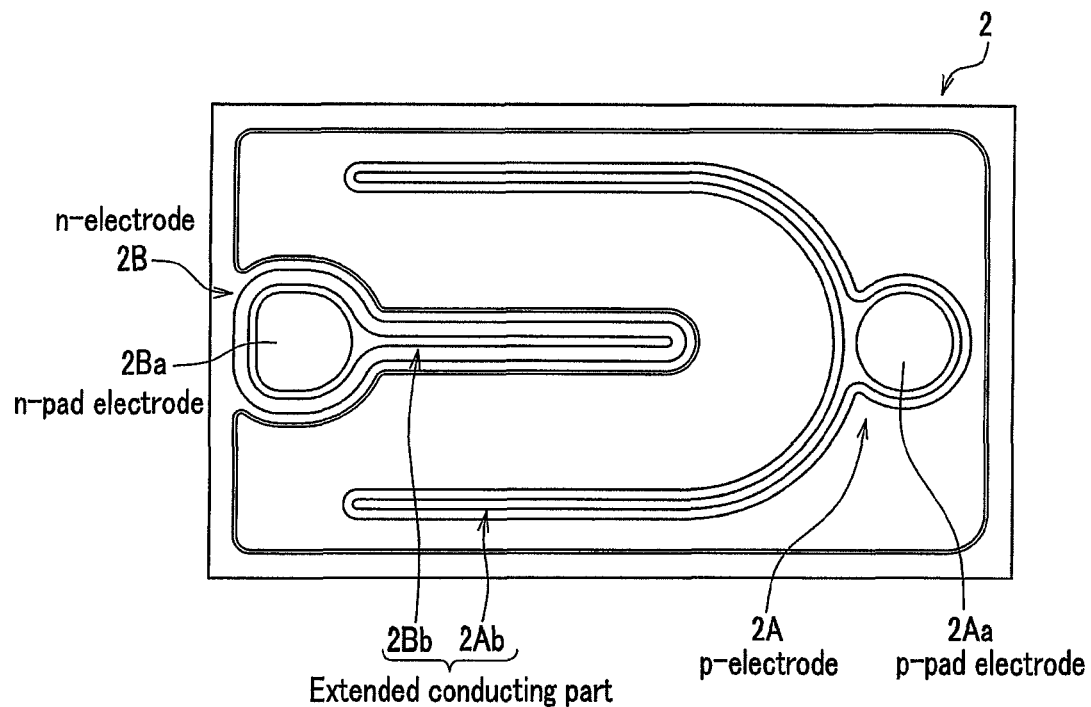
FIG. 3 is an enlarged front view showing the configuration of the light-emitting element.

As shown in FIG. 3, each of the light-emitting elements 2 is formed in a rectangular form. In addition, the light-emitting element 2 is, as shown in FIG. 3, a face up (FU) element in which a p-electrode 2A is formed on one side of an upper face, and an n-electrode B is formed on the other side of the upper face of the light-emitting element 2. In the embodiment, to dispose the metal film 30 for mounting the light-emitting element 2 and the metal members 40 forming the positive electrode 3 and the negative electrode 4 separately, as shown in FIG. 3, it is preferable to use the light-emitting element 2 in which the p-electrode and the n-electrode are formed on the same side to bond a surface opposite to the electrode formation surface to the metal film 30.

A p-electrode 2A and an n-electrode 2B respectively include, as shown in FIG. 3, a p-side pad electrode (p-pad electrode) 2Aa and the n-side pad electrode (n-pad electrode) 2Ba, which are electrode terminals, and the extended conducting parts 2Ab and 2Bb, which are auxiliary electrodes for diffusing the current inputted into the light-emitting element 2 over the whole. In addition, in the light-emitting element 2, it is sufficient that the p-pad electrode 2Aa and the n-pad electrode 2Ba are on the same side, and the extended conducting parts 2Ab and 2Bb may not be disposed. In addition, though being not shown, the light-emitting element 2 has a configuration in which a plurality of semiconductor layers including n-type semiconductor layers and the p-type semiconductor layers when side-viewed.

As the light-emitting element 2, it is preferable to use a light-emitting diode specifically, and one having a desired wavelength can be selected in accordance with the usage. For example, as the light-emitting element 2 of blue color (light having a wavelength of 430 nm to 490 nm) and green color (light having a wavelength of 490 nm to 570 nm), ZnSe, a nitride-based semiconductor ($In_XAl_YGa_{1-X-Y}N$, $0 \leq X$, $0 \leq Y$, $X+Y \leq 1$), GaP, etc. can be used. In addition, as the light-emitting element 2 of red color (light having a wavelength of 620 nm to 750 nm), GaAlAs, AlInGaP, etc. can be used.

In addition, as described later, when a fluorescence substance is introduced into the sealing member 7 (see FIG. 1), it is preferable to use a nitride semiconductor ($In_XAl_YGa_{1-X-Y}N$, $0 \leq X$, $0 \leq Y$, $X+Y \leq 1$) able to emit light having such a short wavelength that the fluorescence substance is efficiently excited. However, the elemental composition, or the emitted color of light of the light-emitting element 2, a size, etc. are not limited to the above description, but can be selected in accordance with the object. In addition, the light-emitting element 2 may be configured with an element outputting a ultra-violet ray or an infra-red ray in addition to light in the visible region of the spectrum. In addition, to increase the output power, the number of the light-emitting elements 2 is, for example, ten or more and at a level of 20 to 150.

The light-emitting elements 2 are arranged on the mounting region 1a in vertical and horizontal directions equidistantly, respectively in FIG. 2. In this example, vertically eight by horizontally five, that is, 40 in total, of light-emitting elements 2 are arranged. In addition, the light-emitting elements 2 adjoining each other in horizontal and vertical directions of the mounting region 1a are, as shown in FIG. 2, connected with electric conducting wires W to have series connection and parallel connection. In addition, the series connection means here such a state that the p-electrode 2A and the n-electrode 2B in the adjoining light-emitting elements 2 are electrically connected with the wire W. In addition, the parallel connection means such a state that the p-electrodes 2A or the n-electrode 2B in the adjoining light-emitting elements 2 are electrically connected to each other with the wires W, respectively.

As shown in FIG. 2, between the wiring part 3b of the positive electrode 3 and the interconnection wiring part 8, the light-emitting elements 2 are arranged such that the p-electrodes 2A of the light-emitting elements 2 are directed in a left side which is one direction of the mounting region 1a and the n-electrodes 2B of the light-emitting elements 2 are directed in a right side which is the other direction of the mounting region 1a.

In addition, as shown in FIG. 2, between the wiring part 4b of the negative electrode 4 and the interconnection wiring part 8, the light-emitting elements 2 are arranged such that the p-electrodes 2A of the light-emitting elements 2 are directed in the right side which is the other direction of the mounting region 1a and the n-electrodes 2B of the light-emitting elements 2 are directed in the left side which is the one direction of the mounting region 1a. In other words, the light-emitting elements 2 are arranged such that a direction thereof is reversed across the interconnection wiring part 8.

In the light-emitting device 100 according to the embodiment, as described above, the interconnection wiring part 8 is formed at a periphery of the mounting region 1a, and the light-emitting elements 2 are arranged such that the direction of the light-emitting elements 2 is reversed across the interconnection wiring part 8, so that the number of the light-emitting elements 2 connected in series and parallel can be increased within a limited area of the mounting region 1a without complexity in wiring connecting the light-emitting elements 2 each other. In addition this provides the arrangement of a plurality of the light-emitting elements 2 at a high density within the limited area of the mounting region 1a, so that the light-emitting device 100 having an enhanced power consumption for the same brightness or the light-emitting device 100 having a light emission efficiency for the same power consumption. In addition, in the light-emitting device 100, as shown in FIG. 2, four light-emitting elements 2 are connected in parallel as well as ten lines of the serial connection are connected in series.

<Metal Member (Positive and Negative Electrodes)>

The metal members 40 are provided for forming the positive electrode 3 and the negative electrode 4 to electrically connect electronic components such as a plurality of the light-emitting elements 2, the protecting element 5 on the substrate 1 to an external power supply to apply the voltage from the external power supply to these electronic components. In other words, the metal members 40 (the positive electrode 3 and the negative electrode 4) are serve as electrodes or parts of the electrodes for supplying electricity from the external.

The positive electrode 3 and the negative electrode 4 include, as shown in FIG. 2, the pad parts (power feeding parts) 3a and 4a in an approximately rectangular shapes and the wiring parts 3b and 4b in a line shapes which are configured to apply the voltage between the pad parts 3a and 4a to a plurality of the light-emitting elements 2 forming the light-emitting part 20 via the wiring parts 3b and 4b. In addition, as shown in FIG. 2, at the wiring part 4b of the negative electrode 4, a cathode mark CM indicating a cathode is formed.

The pad parts 3a, 4a are those to which a voltage is to be applied from an external power supply. The pad parts 3a, 4a are formed as a pair at locations on a diagonal line at corners on the substrate 1 as shown in FIG. 2. The pad parts 3a, 4a are electrically connected to the external power supply (not shown) with electrically conducting wires.

The wiring parts 3b, 4b are those for transmitting the voltage applied to the pad parts 3a, 4a from the external power supply to the light-emitting elements 2 on the mounting region 1a. As shown in FIG. 2, the wiring parts 3b, 4b are formed to extend from the pad parts 3a, 4a as well as in approximately L-shapes at peripheries of the mounting region 1a.

One end part of the wiring part 3b and one end part of the wiring part 4b are formed to adjoin each other at a periphery of the mounting region 1a as shown in FIG. 2. As described above, the wiring parts 3b, 4b of the positive electrode 3 and the negative electrode 4 are formed at the periphery of the mounting region 1a and one ends thereof are formed to adjoin each other. This allows a protecting element 5, mentioned later, to be disposed at an appropriate location even though a plurality of the light-emitting elements 2 are arranged on the substrate 1 such as the light-emitting device 100. Accordingly, it is prevented that the voltage between both positive and negative electrodes becomes equal to or higher than a Zener voltage, which appropriately prevents the light-emitting elements 2 from breakage in elements and performance degradation due to application of an excessive voltage.

In addition, the metal member 40 is formed on an upper surface of the substrate 1 as well as formed separately with a space from circumferential edge of the substrate 1 on a side of the mounting region 1a. In other words, the metal member 40 is formed slightly apart from the circumferential edge of the substrate 1 on a side of the mounting region 1a. Forming the metal member 40 on the upper surface of the substrate 1 and apart from the circumferential edge of the substrate 1 makes the positive electrode 3 and the negative electrode 4 apart from the side face and the back face of the substrate 1, which prevents short-circuit due to creeping discharge when the light-emitting device 100 is driven.

More specifically, it is preferable that the wiring parts 3b, 4b are formed such that one end parts thereof are formed to be adjoined each other within a region of one side of the mounting region 1a in an approximately rectangular shape shown in FIG. 2. As described above, forming the wiring parts 3b, 4b adjoined each other within the region of one side of the mounting region 1a can secure a mounting area for the wire W for electronically connect the wiring parts 3b, 4b to the light-emitting element 2. Accordingly, the number of the light-emitting elements 2 connected to the wiring parts 3b, 4b, more specifically the number of the light-emitting elements 2 at a start point and an end point for the serial connection and the parallel connection, can be increased, so that the number of the lines in the serial connection and the parallel connection of the light-emitting elements 2 can be increased. As described above, increase in the number of lines and rows in the serial connection and parallel connection allows a plurality of the light-emitting elements 2 to be disposed thicker, which provides the light-emitting device 100 having an improved power consumption for the same brightness or an increased light-emitting efficiency for the same electric power consumption.

In addition, it is more preferable that the one ends of the wiring parts 3b, 4b are formed to adjoin each other at a middle point within the one side of the mounting region 1a in the approximately rectangular shape shown in FIG. 2. This equalizes the number of the lines in the serial connection between the wiring part 3b and the interconnection wiring part 8 to the number of lines in the serial connection between the wiring part 4b and the interconnection wiring part 8, so that a plurality of the light-emitting elements 2 can be arranged thicker within the limited area of the mounting region 1a. Accordingly, the light-emitting device 100 having an enhanced electric power consumption for the same constant brightness or an increased light-emitting efficiency for the same electric power consumption.

It is preferable to use Au as the material of the metal member 40 forming the positive electrode 3 and the negative electrode 4. This is because when Au, having an increased heat conductivity, is used as a material of the wire W as described later, the wires W, having the same material, can be strongly bonded.

A method of forming the metal member 40 forming the positive electrode 3 and the negative electrode 4 is electroless plating. A thickness of the metal member 40 forming the positive electrode 3 and the negative electrode 4 is not specifically limited and can be appropriately selected in accordance with aim and use thereof.

Parts of the wiring parts 3b, 4b are, as shown in FIGS. 1 and 2, covered with the light reflecting resin 6 described later. Accordingly, even though the wiring parts 3b, 4b are formed with Au easy to absorb light as described above, the light emitted from the light-emitting element 2 does not reach the wiring part 3b, 4b but is reflected by the light reflecting resin 6. Accordingly, a loss of the output light can be decreased, so that the light output efficiency of the light-emitting device 100 can be increased.

In addition, because the parts of the wiring parts 3b, 4b are covered with the light reflecting resin 6, the wires W can be protected from dust, water, an external force, etc. In addition the parts of the wiring parts 3b, 4b are, as shown in FIG. 2, the part, out of the wiring parts 3b, 4b, formed along the side of the mounting region 1a at a periphery of the mounting region 1a.

<Plating Wire>

The plating wire 31 is provided for forming the metal film 30 by electroplating, one end of which is connected to the metal film 30 as well as the other end is extended to the side face of the substrate 1.

This provides connection to an external electric current source from the side face of the substrate 1, so that electroplating can be performed by a current flowing through the plating wire 31. A material of the plating wire 31 is not specifically limited as long as the material is electrically conducting. For example, W, Ag can be used.

Figure 5A:
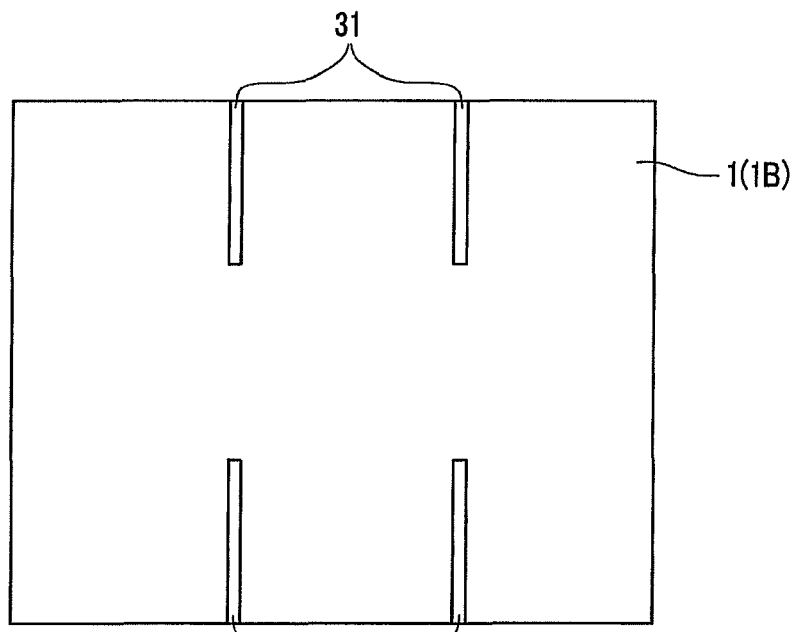
FIG. 5 is a schematic view for illustrating an arrangement of plating wire in the light-emitting device according to the embodiments of the present invention, wherein (a) is a front view showing the arrangement of the plating wire, and (b) is a side view showing the arrangement of the plating wire.
Figure 5B:
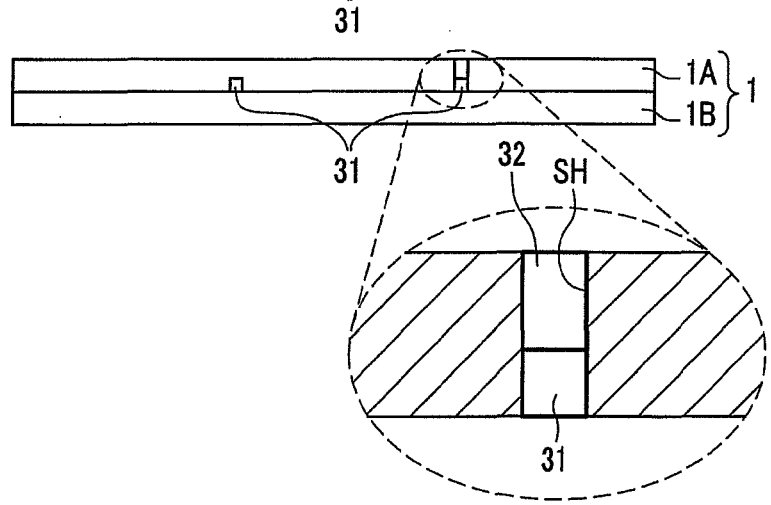

As shown in FIG. 5, the plating wires 31 are disposed inside the substrate 1 and conducted to the metal film 30 through the through hole SH formed in the substrate 1 (see FIG. 2). Because the plating wires 31 are disposed inside the substrate 1, the plating wires 31 can be extended to the side face of the substrate 1 without any limitation in the arrangement of the metal member 40 on the substrate 1. In addition, because the plating wires 31 having a higher heat dissipation than the substrate 1, which is an insulating member, are disposed inside the substrate 1, a heat dissipation can be enhanced. As shown in FIG. 5 (b), the plating wire 31 and the metal film 30 are connected with a conducting member 32 filled in the through hole SH. In FIG. 5 (b), the conducting members 32 are shown only at the broken line part for illustration purpose. As the conducting member 32, W, Ag, etc. can be used. The conducting member 32 may be formed with the same material as the plating wire 31 integrally. In addition, a width of the plating wire 31 may be the same as a width of the through hole SH as shown in FIG. 5 (b). However, the width of the through hole SH may be smaller than the width of the plating wire 31.

Here, exposing from the side face means, as shown in FIG. 5, that a cross section of the plating wire 31, more specifically, only a cross section in parallel to the side face of the substrate 1 is exposed, that the plating wire 31 is exposed at a location slightly hollowed from the side face of the substrate 1 inward of the substrate 1 (for example, about 1 to 8 μm), or that a part of the plating wire 31 is exposed from the side face of the substrate 1. Among them, particularly, it is preferable that the part of the plating wire 31 is exposed from the side face of the substrate 1. For example, an end of the plating wire 31 is disposed at the same plane as the side face of the substrate 1. Accordingly, because a side face of the plating wire 31 is also exposed to the ambient air, the heat dissipation can be further enhanced. In addition, from point view of avoiding short-circuit, as shown in FIG. 5, it is preferable to dispose the plating wires 31 inside the substrate 1, which is an insulating member. Accordingly, when a back face of the substrate 1 is placed on a metal body, short-circuit through the plating wire 31 is prevented because the metal body is not in contact with the plating wires 31.

In addition, it is preferable that the substrate is formed to have one pair of confronting sides and the other pair of confronting sides, the pad part 3a of the positive electrode 3 and the pad part 4a of the negative electrode 4 are formed along one pair of the confronting sides and the plating wires 31 are extended toward the other pair of the confronting sides. More specifically, as shown in FIG. 2, for example, the substrate 1 is formed in a rectangular, the pad parts 3a, 4a are formed in a substantially rectangular of which longitudinal direction is along (in parallel to) one pair of confronting sides of the substrate 1. In addition as shown in FIG. 5, the plating wires 31 are extended to the other pair of the confronting sides which is perpendicular to the sides, that is formed along (in parallel to) a longitudinal direction of the pad parts 3a, 4a.

In addition, arrangement is preferably made such that the pad part 3a of the positive electrode 3 and the pad part 4a of the negative electrode 4 are arranged without overlapping with the plating wires 31. In other words, when the light-emitting device 100 is viewed from an upper position, the pad parts 3a, 4a are preferably formed at laterally shifted locations from the plating wires 31.

This configuration eliminates a possibility of discharging to the pad parts 3a, 4a via the plating wire 31 as relay points when the light-emitting device 100 is driven, so that the short-circuit due to the discharging is prevented.

<Protecting Element>

The protecting element 5 is an element for protecting the light-emitting part 20 including a plurality of the light-emitting elements 2 from breakage of elements and performance degradation due to an excessive voltage application. The protecting element 5 is disposed at one end part of the wiring part 3b of the positive electrode 3 as shown in FIG. 2. However, the protecting element 5 may be disposed at one end part of the wiring part 4b of the negative electrode 4.

The protecting element 5 is formed with, more specifically, a Zener diode (Zener Diode) which becomes in a conducting state when a voltage greater than a prescribed voltage is applied. Though illustration of the protecting element 5 in detail is omitted, the protecting element 5 is a semiconductor having a p-electrode and an n-electrode like the light-emitting element 2 mentioned above, and is electrically connected with the wires W to the wiring part 4b of the negative electrode 4 to have inverse parallel connection to the p-electrode 2A and the n-electrode 2B of the light-emitting element 2.

According to this configuration, though a voltage between the positive electrode 3 and the negative electrode 4 exceeds a Zener voltage of the Zener diode because an excessive voltage is applied thereto, the voltage between the positive and negative electrodes of the light-emitting element is kept at the Zener voltage and does not exceeds the Zener voltage. Accordingly, installation of the protecting element 5 prevents the voltage between the positive and negative electrodes from being higher than the Zener voltage, which prevents breakage of elements in the light-emitting element 2 or degradation in characteristics due to the excessive voltage application.

As shown in FIG. 2, the protecting element 5 is covered with the light reflecting resin 6 described later. Accordingly, the protecting element 5 and the wires W connected to the protecting element 5 are protected from dust, water, external forces, etc. In addition, a size of the protecting element 5 is not specifically limited and can be appropriately selected in accordance with the aim and usage.

<Light Reflecting Resin>

The light reflecting resin 6 is a member for reflecting light emitted from the light-emitting element 2.

The light reflecting resin 6 is formed, as shown in FIG. 2, to cover the parts of the wiring parts 3b, 4b, the interconnection wiring part 8, the protecting element 5, and the wires W connected to these parts. According to this configuration, even in a case where the wiring parts 3b, 4b, the interconnection wiring part 8, and the wires W are formed with Au easy to absorb light as described above and later, the light emitted by the light-emitting element 2 is reflected by the light reflecting resin 6 without the light reaching the wiring parts 3b, 4b, the interconnection wiring part 8, and the wires W. This reduces a loss in the emitted light, so that the light output efficiency of the light-emitting device 100 can be enhanced. In addition, because the light reflecting resin 6 covers the parts of the wiring parts 3b, 4b, the interconnection wiring part 8, the protecting element 5, and the wires W connected to these parts, these parts can be protected from dusts, water, external forces, etc.

The light reflecting resin 6 is formed in a rectangular frame shape to surround the mounting region 1a, as shown in FIGS. 1 and 2, where the light-emitting part 20 is formed on the substrate 1, i.e., along a circumferential edge of the mounting region 1a. As described above, because the light reflecting resin 6 is formed to surround the mounting region 1a, light toward a circumference of the mounting region 1a like, for example, light emitted from the light-emitting elements 2 arranged on both left and right sides in FIG. 4 can be reflected by the light reflecting resin 6. Accordingly, a loss in the emitted light can be reduced, so that the light output efficiency of the light-emitting device 100 can be enhanced.

In addition, as shown in FIG. 2, it is preferable to form the light reflecting resin 6 to cover a part of the circumferential edge of the mounting region 1a. As described above, formation of the light reflecting resin 6 to cover a part of the circumferential edge of the mounting region 1a eliminates a possibility in formation of a region where a part of the substrate is exposed between the wiring parts 3b, 4b and the metal film 30 on the mounting region 1a. Accordingly, because the light emitted by the light-emitting element 2 is all reflected at a region inside which the light reflecting resin 6 is formed, the loss in the emitted light can be reduced to the maximum, so that the light outputting efficiency of the light-emitting device 100 can be enhanced.

As a material of the light reflecting resin 6, an insulating material is preferably used. In addition, to secure some level of stiffness, for example, a thermo-setting resin, a thermoplastic resin, etc. can be used. More specifically, the phenolic resin, the epoxy resin, the BT resin, the PPA, a silicon resin, etc. are usable. In addition, a powder of a reflective material (for example, $TiO_2$, $Al_2O_3$, $ZrO_2$, MgO, etc.), which is hard to absorb light from the light-emitting element 2 and has a larger difference in a refraction index from the resin as a matrix material, is dispersed in the resin as the matrix material, so that the light can be efficiently reflected. A size of the light reflecting resin 6 is not specifically limited, but can be selected in accordance with the aim and usage. In addition, at a location of the light reflecting resin 6, a light reflecting member made of a material different from the resin can be formed.

<Sealing Member>

The sealing member 7 is a member for protecting the light-emitting element 2, the protecting element 5, the metal film 30 and the wires W arranged on the substrate 1 form dusts, water, external forces, etc. The sealing member 7 is formed by filling a resin inside the light reflecting resin 6, i.e., inside of the mounting region 1a surrounded by the light reflecting resin 6 as shown in FIGS. 1, 2, and 4.

As a material of the sealing member 7, a material having a translucency of the light from the light-emitting element 2 is preferable. As a more specific material, the silicone resin, the epoxy resin, and a urea resin, etc. are usable. In addition to the above-described materials, if necessary, a coloring agent, a light diffusion agent, filler, fluorescence members, etc. can be contained.

The sealing member 7 can be formed with a single member or as a plurality of (more than two) layers. A quantity of the sealing member 7 is as much as the sealing member 7 can cover the light-emitting element 2, the protecting element 5, the metal film 30, and the wire W, etc., which are arranged inside the mounting region 1a surrounded by the light reflecting resin 6. In addition, in a case where the sealing member 7 is made have a function of a lens, the sealing member 7 may be formed in a bombshell form or a convex lens form by protruding a surface of the sealing member 7.

<Fluorescence Member>

It is also possible that the sealing member 7 contains a fluorescence member therein for emitting light having a wavelength different from the light from the light-emitting element 2 by absorbing a part of the light from the light-emitting element 2. As the fluorescence member, a member capable of converting the light from the light-emitting element 2 into a longer wavelength is preferable. In addition, the fluorescence member may be formed with a single layer of one kind of fluorescence material, etc or as a single layer in which more than one kind of fluorescence materials, etc are mixed. Alternatively, more than one single layers containing one kind of fluorescence material, etc. are laminated, or more than one single layer in which more than one kind of fluorescence materials are mixed respectively, may be laminated. As a more specific material of the fluorescence member, for example, a YAG-based fluorescence substance having a garnet structure including yttrium and aluminum, a nitride-based fluorescence substance which are mainly activated by lanthanoid elements such as Eu and Ce, etc., and an oxynitride-based fluorescence substance are usable.

<Interconnection Wiring Part>

The interconnection wiring part 8 is a member for interconnection for wiring between the positive electrode 3 and the negative electrode 4. The interconnection wiring part 8 is formed with a metal member on the substrate 1 as shown in FIG. 2. The interconnection wiring part 8 is formed, as shown in FIG. 2, at a periphery of the mounting region 1a in a line form along one side of the mounting region 1a.

The interconnection wiring part 8 is covered with the light reflecting resin 6 as shown in FIG. 2. Accordingly, as described later, even in a case where Au easy to absorb light is used as the metal member forming the interconnection wiring part 8, the light emitted from the light-emitting element 2 does not reach the interconnection wiring part 8, but is reflected by the light reflecting resin 6. This configuration can reduce the loss in the output light, so that the light output efficiency of the light-emitting device 100 can be enhanced. In addition, covering the interconnection wiring part 8 with the light reflecting resin 6 protects the interconnection wiring part 8 from dusts, water, an external force, etc.

As the material of the metal member forming the interconnection wiring part 8, Au is preferable like the positive electrode 3 and the negative electrode 4. This is because when Au, having an increased heat conductivity, is used as a material of the wire W as described later, the wires W, having the same material, can be strongly bonded.

A method of forming the metal member forming the interconnection wiring part 8 is electroless plating like the positive electrode 3 and the negative electrode 4. A thickness of the metal member forming the interconnection wiring part 8 is not specifically limited and can be appropriately selected in accordance with aim and use thereof.

In the light-emitting device 100 according to the embodiment, as described above, the interconnection wiring part 8 is formed at a periphery of the mounting region 1a, and the light-emitting elements 2 are arranged such that the direction of the light-emitting elements 2 is reversed across the interconnection wiring part 8, so that the number of the light-emitting elements 2 connected in series and parallel can be increased within the limited area of the mounting region 1a without complexity in wiring connecting the light-emitting elements 2 each other. In addition this provides the arrangement of a plurality of the light-emitting elements 2 at a high density within the limited area of the mounting region 1a, so that the light-emitting device 100 having an improved power consumption for the same brightness or the light-emitting device 100 having a light emission efficiency for the same power consumption.

<Wire>

The wire W is an electrically conducting wiring for electrically connecting the electronic components such as the light-emitting element 2 and the protecting element 5, to the positive electrode 3 and the negative electrode 4, and the interconnection wiring part 8, etc. As a material of the wire W, a metal such as Au, Cu (copper), Pt (platinum), Al (aluminium) and an alloy of the same can be used. Particularly, it is preferable to use Au having a superior heat conductivity. In addition, a diameter of the wire W is not specifically limited, but can be appropriately selected in accordance with the aim and the usage.

A connection parts between the wire W and the positive electrode 3, the negative electrode 4, and the interconnection wiring part 8 are covered with the light reflecting resin 6 as shown in FIG. 2. Accordingly, as described above, even in a case where Au easy to absorb light, is used as a material of the wire W, the light emitted by the light-emitting elements 2 is not absorbed by the wires W, but reflected by the light reflecting resin 6. This configuration can reduce the loss in the output light, so that the light output efficiency of the light-emitting device 100 can be enhanced. In addition, covering the interconnection wiring part 8 with the light reflecting resin 6 protects the interconnection wiring part 8 from dusts, water, an external force, etc. The light outputted from the light-emitting device 100 is light emitted at a surface of the sealing member 7 surrounded by the light reflecting resin 6 as shown in FIGS. 1 and 4. In other words, the surface of the sealing member 7 is a light-emitting surface of the light-emitting device 100.

[Operation of Light-Emitting Device]

According to the light-emitting device 100 as described above, when the light-emitting device 100 is driven, light advancing upward out of the light emitted from the light-emitting element 2 advancing in all directions is outputted toward the external above the light-emitting device 100. In addition, the light advancing downward or lateral directions is reflected by a bottom or side walls in the mounting region 1*a* on the substrate 1 and is outputted upwards of the light-emitting device 100. In this operation, the bottom of the substrate 1, i.e., the metal film 30 covers the mounting region 1*a* and the light reflecting resin 6 is formed around the mounting region 1*a*, so that light absorption there is suppressed as well as light is reflected by the metal film 30 and the light reflecting resin 6. Accordingly, the light from the light-emitting element 2 is outputted from the light-emitting elements 2 at a high efficiency.

<<Method of Manufacturing the Light-Emitting Device>>

Next with reference to the drawings will be described a method of manufacturing the light-emitting device according to the embodiment of the invention in which an example shown in FIGS. 1 to 5 is taken.

The method of manufacturing the light-emitting device 100 according to the present invention includes a substrate manufacturing process, a plating process, a die bonding process, and a wire bonding process. In addition, after the wire bonding process, a light reflecting resin forming process and a sealing member filling process may be included. Moreover, the method includes a protection element bonding process here.

Hereinbelow will be described each process. Because the configuration of the light-emitting device has been described above, a further description may be omitted occasionally.

<Substrate Manufacturing Process>

The substrate manufacturing process is a process for manufacturing the substrate 1 on which the plating wire 31 is formed.

In the substrate manufacturing process, parts to be made as the mounting region 1*a*, the positive electrode 3, and the negative electrode 4 on the substrate 1 are formed by patterning the parts in predetermined shapes. In addition, in the substrate manufacturing process, the plating wires 31 for forming the metal film 30 at the mounting region 1*a* on the substrate 1 are formed by electroplating. The plating wires 31 can be formed inside the substrate 1, i.e., on an upper face of the lower substrate 1B by a method of printing, etc.

In addition, at the parts to be plated such as the parts to be made as the mounting region 1*a*, the positive electrode 3, and the negative electrode 4, Ni films are previously formed as backing layers by a method of electroplating, electroless plating, spattering, etc. In the plating process, plating is carried out on the Ni backing layer.

In addition, as shown in FIG. 2, in the substrate 1, a through hole SH for electrically connecting the plating wire 31 inside the substrate 1 to the metal film 30. Moreover, the through hole SH is filled with W therein and connected to the plating wire 31 and then, covered with the metal film 30. As shown in FIG. 5(*b*), the upper substrate 1A is lapped over the lower substrate 1B and the upper substrate 1A on the lower substrate 1B is made as one substrate 1.

<Plating Process>

The plating process is a process of forming the metal member 40 for providing the positive electrode 3 and the negative electrode 4 by electroless plating on the substrate 1 in which the plating wires 31 have been formed as well as forming the metal film 30 at the mounting region 1*a* on the substrate 1 by electroplating. In a case where the interconnection wiring part 8 is installed, a metal member is formed in a similar process to the process forming the positive electrode 3 and the negative electrode 4.

Here, an order of forming the metal member 40 by the electroless plating and the metal film 30 by the electroplating is indefinite. However, it is preferable that first the metal members 40 for the positive electrode 3 and the negative electrode 4 are formed as well as another metal member 40 is also formed at the mounting region 1*a* and then the metal film 30 is formed by the electroplating on the metal member 40 at the mounting region 1*a*.

If the metal film 30 is formed by the electroplating in advance, it is necessary to use a mask, etc. to prevent the metal film 30 from being covered with the metal member 40 in a case where the metal member 40 is formed by electroless plating after formation of the metal film 30. Accordingly, the manufacturing process becomes complicated. On the other hand, if the metal film 30 is formed by the electroplating, after the metal member 40 is formed by the electroless plating, it becomes unnecessary to use a mask, etc. because the metal film 30 is formed on the metal member 40 at the mounting region 1*a*. In addition, because the metal film 30 is formed through the metal member 40, flatness of the metal film 30 is enhanced, so that the output efficiency of the light emitted by the light-emitting elements 2 can be enhanced.

The method of the electroless plating and the electroplating are not specifically limited, but may be carried out by the conventional known method.

<Die Bonding Process>

The die bonding process is a process for installing the light-emitting elements 2 on the metal film 30. The die bonding process includes an installing process for the light-emitting element and a heating process.

[Installing Process for the Light-Emitting Element]

The installing process for the light-emitting element is a process of installing the light-emitting element 2 through a bonding member (not shown) on the substrate 1 (on the metal film 30).

The light-emitting element 2 is bonded to the metal film 30 on the substrate 1 with the bonding member. In addition, at a back face of the light-emitting element 2 may be previously coated with flux. Here, because it is sufficient to provide the bonding member such that the bonding member intervenes between the metal film 30 and the light-emitting element 2, the bonding member may be formed only at a region where the light-emitting elements 2 are placed out of the area of the metal film 30, or only on the side of the light-emitting elements 2. Alternatively, the bonding member may be formed on both sides.

When the boding member in a liquid state or a paste state is formed on the metal film 30, one is appropriately selected from a potting method, a printing method, a transferring method, etc. Next, the light-emitting elements 2 are placed on the parts where the bonding members are formed. In addition, when a bonding member in a solid sate is used, after the bonding member in the solid state is placed, the light-emitting elements 2 can be placed on the metal film 30 in the same manner as the bonding member in the liquid state or the paste state. In addition, the light-emitting element 2 may be fixed at a desired location on the metal film 30 by that the bonding member in the solid state or the paste state is once melted by heating, etc.

[Heating Process]

The heating process is a process of bonding the light-emitting element 2 onto the substrate 1 (onto the metal film 30) by heating the bonding member after the light-emitting element 2 is placed.

The bonding member may be an insulating member, and heating in the heating process is carried out at a temperature higher than a temperature at which at least a part of the bonding member vaporizes. In addition, when the bonding member includes a thermo-setting resin, it is preferable to heat the bonding member at temperature higher than a temperature at which hardening in the thermo-setting resin begins. In this manner, the light-emitting element 2 can be bonded and fixed to with the thermo-setting resin. In addition, for example, in a case where resin components including rosin, and a metal having a low melting temperature are used, when the metal having a low melting temperature is placed on the metal film 30, it is preferable to heat them a temperature higher than a temperature at which the metal having the low melting temperature melts.

In addition to the heating in the heating process, a cleaning process may be successively done after the heating.

For example, when the resin components are used as the bonding member, after a part of the resin components is vaporized by heating, the remaining resin components can be further removed by a cleaning process after a part of the resin components is lost by vaporization (remaining bonding member cleaning process). Particularly, when the resin components include rosin, it is preferable to carry out cleaning after heating. As a cleaning liquid, it is preferable to use a glycol ether series organic solvent.

<Protecting Element Bonding Process>

The protecting element bonding process is a process for placing the protecting element 5 on the wiring part 3b of the positive electrode 3 and for bonding the protecting element 5.

Bonding the protecting element 5 can be carried out at the same time as the bonding the light-emitting elements 2, but may be done before or after bonding the light-emitting elements 2. Because the method of installing and bonding the protecting element 5 is the same as the die bonding process, the description is omitted here.

<Wire Bonding Process>

The wire bonding process is a process for electrically connecting the positive electrode 3 of the metal member 40 to the electrode terminal (pad electrode) at an upper part of the light-emitting element 2 with the wires W after the die bonding process. Similarly, the wire bonging process is a process for electrically connecting the electrode terminals (pad electrode) at the upper part of the light-emitting element 2 to the negative electrodes 4 of the metal member 40 with the wires W. In addition, in this process, a plurality of the light-emitting elements 2 are connected through electrode terminals (pad electrodes), respectively. In addition, electrical connection between the protecting element 5 and the negative electrode 4 is carried out by this process. In other words, the electrode terminal at an upper part of the protecting element 5 is connected to the negative electrode 4 with the wire W. A method of connecting the wire W is not specifically limited, but may be carried out by a generally used method.

<Light Reflecting Resin Forming Process>

The light reflecting resin forming process is a process of forming the light reflecting resin 6 along a circumferential edge of the mounting region 1a to cover at least the wiring parts 3b, 4b of the positive electrode 3 and the negative electrode 4 after the wire bonding process.

Formation of the light reflecting resin 6 can be carried out with, for example, a resin dispenser (not shown) movable upwardly and downwardly or horizontally relative to the substrate 1 above the substrate 1 fixed (see JP2009-182307 A).

In other words, the light reflecting resin 6 is formed in the vicinity of the light-emitting elements 2 by moving the resin dispenser filled with a resin with liquid resin being discharged from a nozzle at a tip of the resin dispenser. A moving speed of the resin dispenser can be appropriately adjusted in accordance with a viscosity or a temperature, etc. of the used resin. In order that a plurality of the light reflecting resins 6 have substantially the same widths, a constant speed movement is preferable at least during discharging the resin. When discharging the resin is interrupted during movement, the moving speed during that period can be changed. Also it is preferable to make a quantity of discharged resin constant. In addition it is preferable that the movement speed of the resin dispenser and the discharging quantity of the resin are made constant. The quantity of the discharged resin can be controlled by making constant the pressure, etc during discharging.

<Sealing Member Filling Process>

The sealing member filling process is a process of filling the sealing member 7 having a translucency for covering the light-emitting elements 2 and the metal film 30 inside the light reflecting resin 6.

More specifically, the sealing member 7 for covering the light-emitting element 2, the protecting element 5, the metal film 30, the wire W, etc. is formed by injection of a melted resin inside walls made of the light reflecting resin 6 formed on the substrate 1 and hardening of the resin by heating or light emission, etc. after that.

The embodiments of the present invention have been described. However, the present invention is not limited to the embodiments and can be modified without departure from the sense of the present invention.

In other words, the embodiments are only examples for embodying the technical concept of the present invention, but the present invention is not limited to the embodiments of the light-emitting device. In addition, members described in claims are not limited to the members described in the embodiments. Particularly, sizes, qualities of materials, shapes, and relative arrangement, etc. are not for limiting the scope of the invention to only those shown in the examples, but are only examples for illustration unless otherwise specified.

For example, the following configuration is also possible as other embodiments.

Other Embodiments

Figure 6:
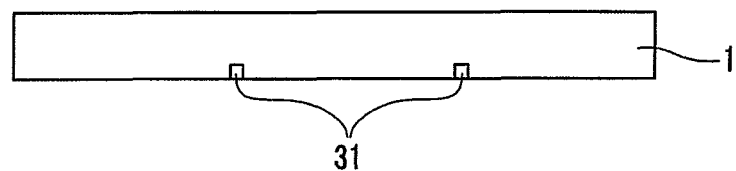
FIG. 6 is a side view showing a configuration of a substrate and the arrangement of the plating wire in the light-emitting device according to another embodiment of the present invention.

As shown in FIG. 6, the substrate 1 may be formed with a sheet of substrate. The plating wire 31 is formed inside the substrate 1 in the above embodiment, but the plating wire 31 may be formed at a lower part of the substrate 1. When the substrate 1 is formed with a sheet of substrate, there is no necessity to lap two sheets of substrates (the upper substrate 1A, the lower substrate 1B), but formed with a sheet of substrate, and thus the manufacturing process can be simplified. In addition, because the plating wire 31 is formed at the lower part of the substrate 1, so that heat dissipation can be enhanced.

Figure 7:
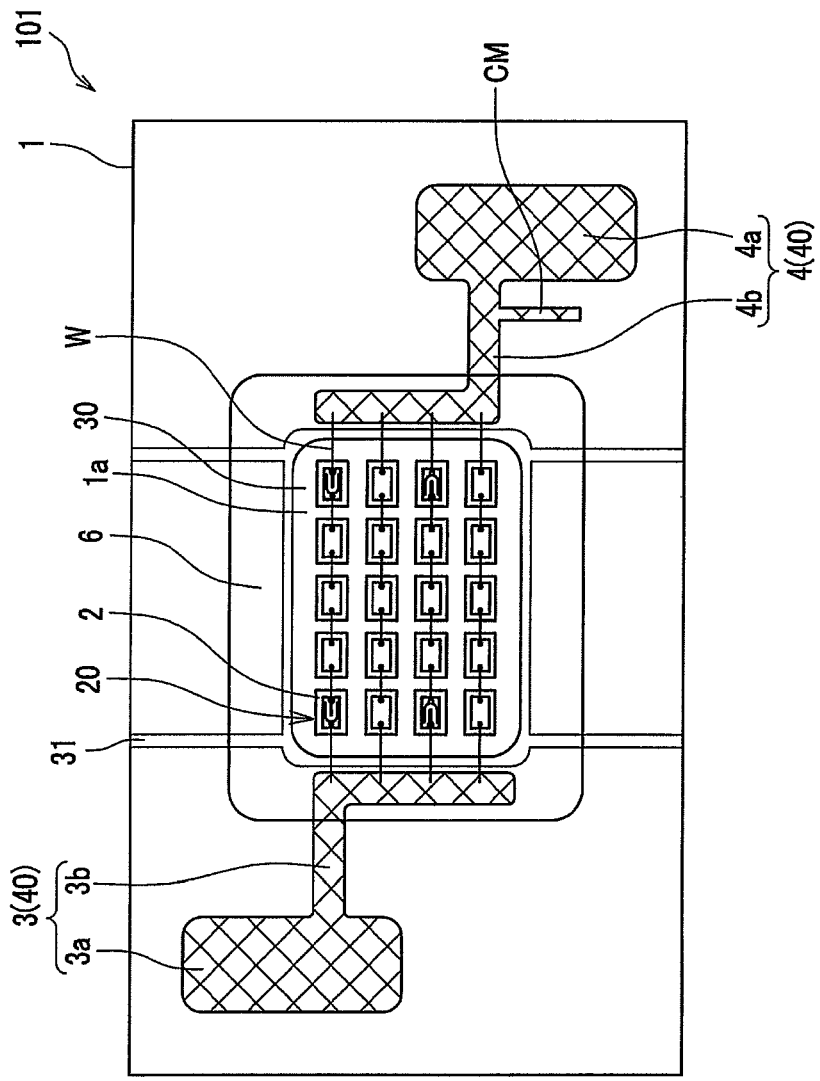
FIG. 7 is a front view showing the configuration of the light-emitting device according to another embodiment of the present invention.

Moreover, as shown in FIG. 7, the light-emitting device 101 may have such a configuration that the plating wire 31 is disposed on an upper face of the substrate 1. Such a configuration allows the plating wire 31 to be simply formed. In this case also, the substrate 1 can be formed with one sheet of substrate. For explanation purpose, only exterior of the light reflecting resin 6 is shown in the front view of FIG. 7 with lines in a transparent state.

In addition, though not shown in drawings, there may be a serial connection for electrically connecting the light-emitting elements 2 adjoining each other in lateral direction of the mounting region 1a with the electrically conducting wires W.

In other words, the p-electrode 2A and the n-electrode 2B of the adjoining light-emitting elements 2 are electrically connected with the wire W. This configuration makes the manufacture of the light-emitting device easy and simple. Further, a connection status between the light-emitting element 2 and the wire W, a connection status of the light-emitting element 2 to the positive electrode 3 and the negative electrode 4, etc. may be modified in any connection status as long as the modification is possible as the configuration of the light-emitting device.

When a formation location of the plating wire 31 or the configuration of the substrate 1 is modified, the substrate 1 is manufactured to have these configurations described above in the manufacturing method of the light-emitting device.

In addition, in the manufacturing method of the light-emitting device, additional process other than the process described above may be included between, before, or after the processes described above as long as there is no adverse effect on the respective processes. For example, other process can be included such as a substrate cleaning process for cleaning the substrate, an undesired substance removing process for removing undesired substance such as dust, an installation place adjusting process for adjusting the installation place of the light-emitting element, the protecting element.

DESCRIPTION OF REFERENCE SIGN 1 substrate
1A upper substrate
1B lower substrate
1a mounting region
2 light-emitting element
2A p-electrode
2Aa p-pad electrode
2Ab extended conducting part
2B n-electrode
2Ba n-pad electrode
2Bb extended conducting part
3 positive electrode
3a pad part
3b wiring part
4 negative electrode
4a pad part
4b wiring part
5 protecting element
6 light reflecting resin
7 sealing member
8 interconnection wiring part
20 light-emitting part
30 metal film
31 plating wire
32 conducting member
40 metal member
100, 101 light-emitting device
CM cathode mark
SH through hole
W wire

The invention claimed is:

1. A light-emitting device comprising:
a substrate;
a metal film at a mounting region on the substrate;
a light-emitting part including a plurality of light-emitting elements disposed on the metal film;
metal members formed on the substrate, respectively including pad parts and wiring parts, forming positive and negative electrodes configured to apply a voltage to the light-emitting element through the wiring parts, respectively; and
a plating wire connected to the metal film and extended to a side face of the substrate, wherein
the metal film and the metal members are independently disposed, wherein
the wiring part of the positive electrode and the wiring part of the negative electrode are formed at the periphery of the mounting region, and wherein
the metal members are formed apart from a circumferential edge of the substrate on a side of the mounting region of the substrate.

2. The light-emitting device as claimed in claim 1, wherein the plating wire is installed inside the substrate and connected to the metal film via a through hole formed in the substrate.

3. The light-emitting device as claimed in claim 2, wherein one part of the plating wire installed in the substrate is exposed on a side face of the substrate.

4. The light-emitting device as claimed in claim 1, wherein
the substrate is formed in a predetermined shape having a pair of confronting sides and another pair of confronting sides, wherein
the pad of the positive electrode and the pad of the negative electrode are formed along the one pair of the confronting sides, and wherein
the plating wire is extended to another pair of the confronting sides.

5. The light-emitting device as claimed in claim 1, wherein the pad of the positive electrode and the pad of the negative electrode are not overlap with the plating wire.

6. The light-emitting device as claimed in claim 1, wherein the metal film has a reflectivity regarding light emitted by the light-emitting element higher than the metal member.

7. The light-emitting device as claimed in claim 6, wherein Ag is used as the metal film and Au is used as the metal member.

8. The light-emitting device as claimed in claim 1, wherein
a light reflecting resin is formed along a circumferential edge of the mounting region to cover at least the wiring part, and wherein
a sealing member having a translucency is filled inside the light reflecting resin to cover the light-emitting element and the metal film.

9. A method of manufacturing the light-emitting device, comprising:
a substrate manufacturing process of manufacturing a substrate having a side face and a back face where a plating wire is formed, wherein the plating wire extends to the side face but not to the back face of the substrate;
a plating process comprising:
forming a metal member providing positive and negative electrodes on the substrate where the plating wire is formed by electroless plating, and
forming a metal film by electroplating at a mounting region on the substrate;
a die bonding process of installing a light-emitting element on the metal film;
a wire bonding process of electrically connecting the positive electrode and the negative electrode to electrode terminals of the light-emitting element with wires after the die bonding process.

10. The method as claimed in claim 9, wherein the plating process comprises:
forming metal members for providing the positive electrode and the negative electrode by electroless plating as well as at the mounting region, and then forming the metal film on the metal member at the mounting region by electroplating.

11. The method as claimed in claim 9, further comprising a light reflecting resin forming process of forming a light reflecting resin to cover at least wiring parts of the positive electrode and the negative electrode along a circumferential edge of the mounting region.

12. The method as claimed in claim 11, further comprising a sealing member filling process of filling a sealing member having a translucency inside the light reflecting resin to cover the light-emitting element and the metal film.

* * * * *